(12) United States Patent
Parkhurst et al.

(10) Patent No.: US 7,042,285 B2
(45) Date of Patent: May 9, 2006

(54) RF POWER AMPLIFIER WITH LOAD INSENSITIVE INDIRECT FORWARD POWER DETECTOR

(76) Inventors: Ray Myron Parkhurst, 39120 Argonaut #273, Fremont, CA (US) 94538; Bartholomeus Hendrik Jansen, 1233 Fairview Ave., San Jose, CA (US) 95125; Lovell H. Camnitz, 1682 Fremont St., Apt. 2, Santa Clara, CA (US) 95050; Camille A Lesko, 972 Cherrystone Dr., Los Gatos, CA (US) 95032

( * ) Notice: Subject to any disclaimer, the term of this patent is extended or adjusted under 35 U.S.C. 154(b) by 58 days.

(21) Appl. No.: 10/832,791

(22) Filed: Apr. 26, 2004

(65) Prior Publication Data
US 2005/0237110 A1 Oct. 27, 2005

(51) Int. Cl.
*H03G 3/20* (2006.01)

(52) U.S. Cl. .................... 330/140; 330/278; 330/279

(58) Field of Classification Search ............ 330/140, 330/136, 133, 250, 254, 277, 278, 279
See application file for complete search history.

(56) References Cited

U.S. PATENT DOCUMENTS

| | | | | |
|---|---|---|---|---|
| 4,759,035 A | * | 7/1988 | McGary et al. | 375/230 |
| 5,168,148 A | * | 12/1992 | Giebel | 235/462.26 |
| 6,073,848 A | * | 6/2000 | Giebel | 235/462.26 |
| 6,728,026 B1 | * | 4/2004 | Lee et al. | 359/337.11 |
| 6,836,187 B1 | * | 12/2004 | Jansen et al. | 330/279 |
| 2002/0146993 A1 | * | 10/2002 | Persico et al. | 455/126 |
| 2002/0153952 A1 | * | 10/2002 | Louis et al. | 330/151 |
| 2004/0056720 A1 | | 3/2004 | Jansen et al. | |
| 2004/0097209 A1 | * | 5/2004 | Haub et al. | 455/242.1 |

* cited by examiner

*Primary Examiner*—John B Nguyen

(57) ABSTRACT

A power amplifier circuit includes an adjustable gain power amplifier for amplifying an RF input signal. An isolated node in the adjustable gain power amplifier is isolated from the output load by a gain stage of the adjustable gain power amplifier. The power level of a signal at the isolated node corresponds to the power level of a signal at the output load. A detector is either capacitively coupled to the isolated node or connected by a direct current (DC) connection. The detector detects the power level of the signal at the isolated node. The detector generates a power level indicator that is sent to a gain control circuit. The gain control circuit adjusts the gain of the adjustable gain power amplifier to maintain a constant drive level at the isolated node.

18 Claims, 3 Drawing Sheets

RF POWER AMPLIFIER WITH LOAD INSENSITIVE INDIRECT FORWARD POWER DETECTOR

BACKGROUND OF THE INVENTION

Wireless communication devices (such as cellular phones) use power amplifiers to amplify and transmit radio frequency (RF) signals. These RF signals must be transmitted at a prescribed power level despite varying environmental conditions such as temperature, supply voltage, load impedance, etc. Generally, the output of a power amplifier should be maintained at the prescribed power level, since excessive power levels needlessly drain a battery supply and may also violate health and safety requirements.

FIG. 1 shows a prior art RF amplifier circuit 11. A power amplifier 13 amplifies an RF input signal 14 and generates an output signal 17 at a prescribed power level. A directional coupler 15 directs a portion ("coupled signal 18") of the output signal 17 and sends the coupled signal 18 to a detector 19. The detector 19 detects the peak voltage $V_{pk}$ of the coupled signal 18 and applies it to a comparator 21. The comparator 21 compares $V_{pk}$ with a reference voltage $V_{ref}$, where $V_{ref}$ typically represents the prescribed power level required by the operating protocol. The output of the comparator 21 is a gain control signal 23 that adjusts the gain of the power amplifier 13.

The prior art RF amplifier circuit 11 has several disadvantages. For example, the drive level into output stage of the power amplifier 13 is not limited. Under certain load conditions, the power amplifier 13 has poor linearity that can cause RF spectrum failures, or unnecessary current drain. Also, the directional coupler 15 is connected at the output of the amplifier circuit 11, diverting part of the output signal 17 to the detector 19. This reduces the power of the transmitted output signal 17, which means that the overall system efficiency suffers, and the power amplifier 13 must be designed to amplify with greater power to account for the drain on the signal by the directional coupler 15. Furthermore, the directional coupler is typically a surface mount component that is expensive and takes up a relatively large area. Therefore, there remains a need for an improved RF amplifier circuit.

SUMMARY OF THE INVENTION

In a preferred embodiment, a power amplifier circuit includes an adjustable gain power amplifier for amplifying an RF input signal. An isolated node in the power amplifier is isolated from the output load by a gain stage of the power amplifier. The power level of a signal at the isolated node corresponds to the power level of a signal at the output load. A detector is either capacitively coupled to the isolated node, or connected by a direct current (DC) connection. The detector detects the power level of the signal at the isolated node. The detector generates a power level indicator that is sent to a gain control circuit. The gain control circuit adjusts the gain of the power amplifier to maintain a constant drive level at the isolated node.

Further features and advantages of the present invention, as well as the structure and operation of preferred embodiments of the present invention, are described in detail below with reference to the accompanying exemplary drawings. In the drawings, like reference numbers indicate identical or functionally similar elements.

DETAILED DESCRIPTION

Figure 1:
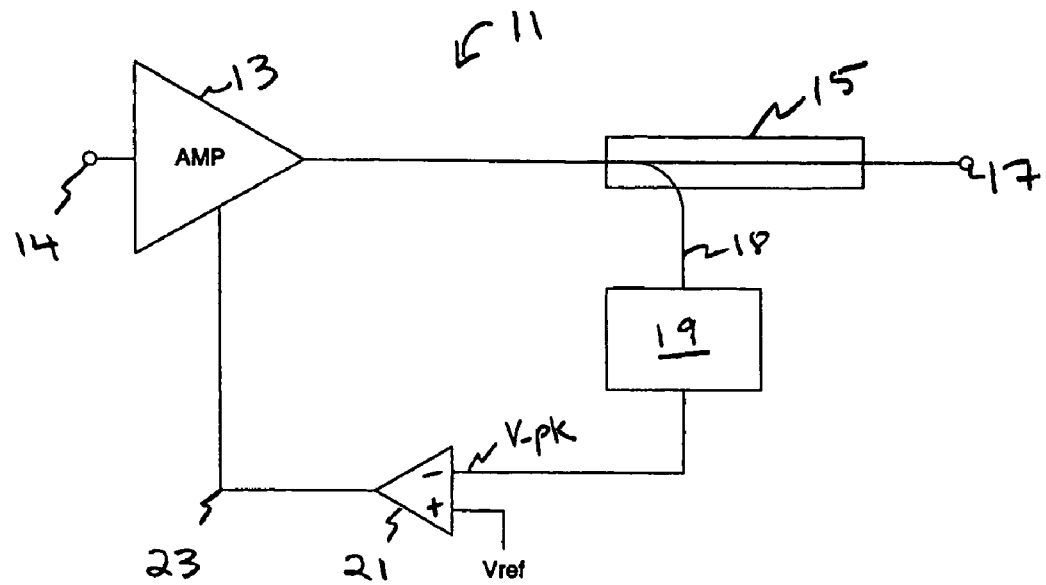
FIG. 1 shows a prior art RF amplifier circuit.
Figure 2:
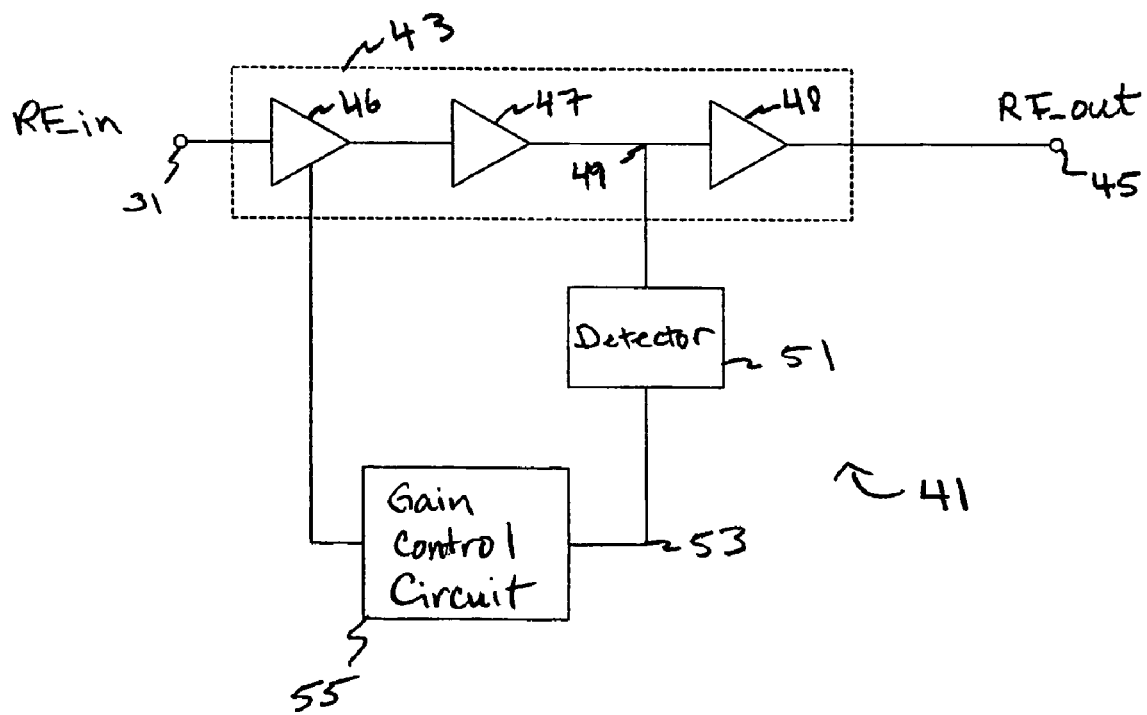
FIG. 2 illustrates a simplified block diagram of a power amplifier circuit.

FIG. 2 illustrates a simplified block diagram of a power amplifier circuit 41, according to a preferred embodiment of the present invention. The power amplifier circuit 41 includes an adjustable gain power amplifier 43 ("power amplifier") for amplifying an RF input signal RF_in at an input 31. The power amplifier 43 produces an amplified signal RF_out at an output 45. In one embodiment, the frequency of RF_in and RF_out are both above 400 megahertz.

The power amplifier 43 has 3 cascaded gain stages: a pre-driver gain stage 46, a driver gain stage 47, and an isolating gain stage 48 (also known as an output gain stage). However, in other embodiments, the power amplifier 43 may include one or a plurality of gain stages. The output of driver gain stage 47 is connected to the input of isolating gain stage 48 at node 49. The isolating gain stage 48 isolates a node 49 in the power amplifier 43 from the output 45. Various nodes of the power amplifier circuit 41 are designated using reference numbers in FIG. 2 and in subsequent figures. For convenience, the same reference number is used to designate a node as well as the signal present at the node.

The signal at node 49 ("corresponding signal 49") has a power level that corresponds to the power level of the output signal RF_out. The isolating gain stage 48 isolates the corresponding signal 49 from variations in the load at output 45. For example, any constructive or destructive interference of the output signal RF_out caused by mismatched load impedances at the output 45 will not affect the corresponding signal 49 due to the isolating properties of output gain stage 48.

A detector 51 is connected to node 49. Unlike the transmission line coupled connection formed by the directional coupler 15 in the prior art, detector 51 is either capacitively coupled to node 49 or directly connected as a DC connection. The preferred embodiment has the detector 51 capacitively coupled to node 49, because any DC biases can be blocked. However, no capacitor is shown in FIG. 2, because that capacitor is typically formed as part of the detector 51.

The detector 51 detects the power level of the corresponding signal 49 and generates a power indicator 53. The power indicator 53 is sent to a gain control circuit 55, which adjusts the gain of the power amplifier 43 accordingly. In the embodiment shown in FIG. 2, the gain control circuit 55 adjusts the gain of the power amplifier 43 by adjusting the pre-driver gain stage 46. However, in other embodiments, the gain of the power amplifier 43 may be adjusted by adjusting the driver gain stage 47, or by adjusting both the pre-driver gain stage 46 and the driver gain stage 47.

The detector 51 and the gain control circuit 55 form a feedback loop that maintains a constant drive level into the isolating gain stage 48 at node 49. Consequently, the output power of RF_out remains at a relatively constant level under varying and mismatched load conditions. Since the detector 51 is now connected to the isolated node 49 rather than to the output 45, the detector 51 does not diminish the output power level of RF_out. This reduces the total current drawn from the power supply, which is especially useful for wireless communication devices with limited battery charge. Also, the power amplifier 43 can be designed to be smaller and have lower power consumption compared with the prior art circuit. Furthermore, eliminating the directional coupler allows the detector 51 and power amplifier 43 to be fabricated on a single integrated circuit.

The power amplifier circuit 41 works well to minimize output power distortion in systems using linear modulation schemes. In linear modulation schemes, there is a linear correlation between the power level of the corresponding signal 49 and the output signal RF_out. As a result, the power indicator 53 generated by the detector 51 is a fairly accurate representation of the actual power of the output signal RF_out. Suitable linear modulation schemes include Enhanced Data rate for GSM Evolution (EDGE), Code Division Multiple Access (CDMA), North American Digital Cellular (NADC), and Wideband Code Division Multiple Access (WCDMA).

However, the present invention is also useful for minimizing output power variation in saturated power amplifier schemes such as Global System for Mobile Communications (GSM), Advanced Mobile Phone Service (AMPS), Universal Mobile Telecommunications System (UMTS), or any other Frequency Modulation (FM), Phase Modulation (PM), polar, or other constant envelope modulation schemes.

Figure 3:
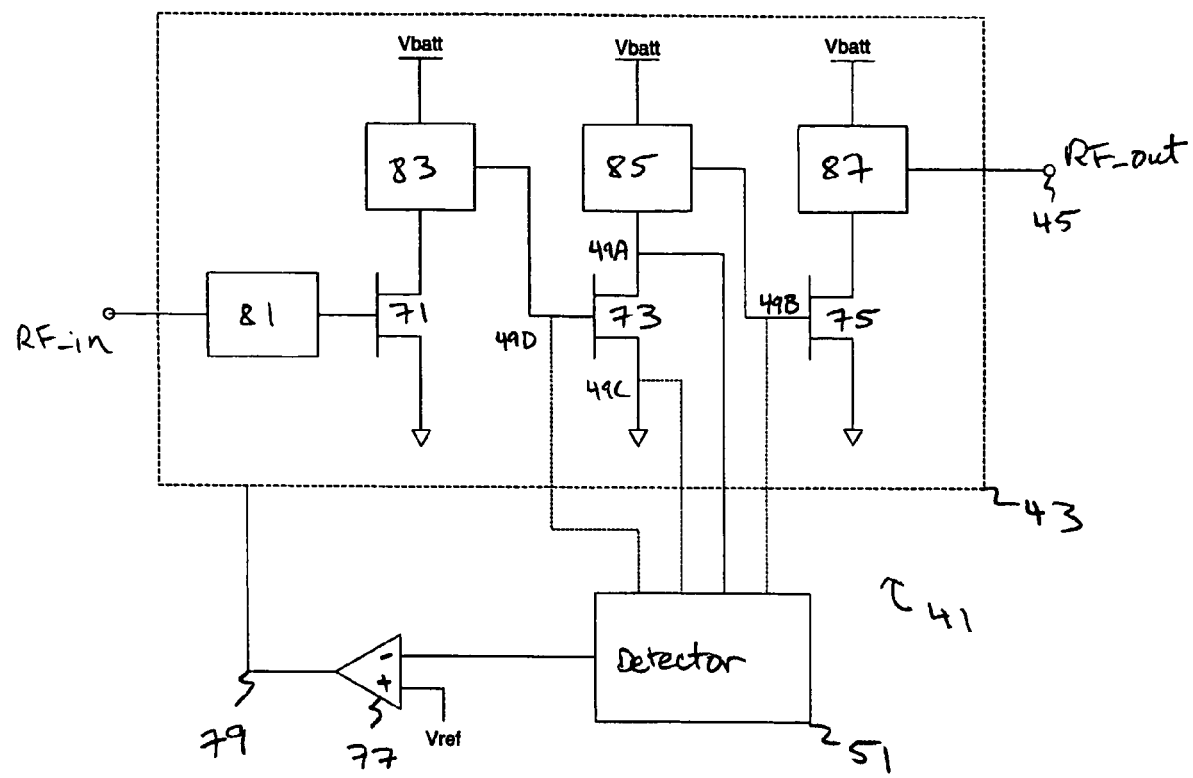
FIG. 3 shows one implementation of an embodiment of the power amplifier circuit.

FIG. 3 shows one implementation of an embodiment of the power amplifier circuit 41. The power amplifier 43 is implemented with three cascaded transistors 71, 73, and 75, respectively, with each transistor functioning as a gain stage. All three transistors are powered by a voltage source Vbatt, which is typically a rechargeable battery in mobile communication devices. A matching network 81 is connected between the input RF_in and the gate of transistor 71. The matching network 81 matches the input impedance to the impedance of the power amplifier 43.

Another matching network 83 is connected between the drain of transistor 71 and the gate of transistor 73. Yet another matching network 85 is connected between the drain of transistor 73 and the gate of transistor 75. Matching networks 83 and 85 separate the output of transistors 71 and 73 from the input of the subsequent transistor, so as to maintain the correct bias and operation of each transistor.

A final matching network 87 is connected between the drain of transistor 75 and the output 45 (RF_out). The final matching network 87 matches the output impedance of the power amplifier 43 with the load impedance. Matching networks 81, 83, 85, and 87 are well known in the art and therefore will not be described in further detail. Generally, however, the matching networks are LC circuits.

In other embodiments, the power amplifier 43 may include one transistor or a plurality of transistors. The output transistor 75 functions as the isolating gain stage. The transistor 75 has a high internal gate-to-drain impedance that isolates the output node 45 and the load at output node 45 from a node 49A within the power amplifier 43.

In an actual working embodiment, transistors 71, 73, and 75 are enhancement-mode pseudomorphic high electron mobility transistors (E-pHEMT). However, other transistors such as pseudomorphic high electron mobility transistors (pHEMT), heterojunction bipolar transistors (HBT), bipolar junction transistors (BJT), lateral diffusion metal oxide semiconductor field effect transistors (LDMOS FET), metal oxide semiconductor field effect transistors (MOSFET), complementary metal oxide semiconductors (CMOS), field effect transistors (FET), and metal semiconductor field effect transistors (MESFET) may also be used.

The detector 51 detects the power level of a signal at node 49A. There are many possible configurations for detector 51. For example, the peak power level at node 49A is proportional to the square of the peak voltage at node 49A, since $P=V^2/R$. And since the power level at node 49A is linearly proportional to the power level at the output RF_out, determining the peak voltage at node 49A will provide a fair estimate of the power level at RF_out. One such detector configuration is described in more detail in U.S. patent application #10/252,923, RF Peak-to-Peak Detector with Wide Dynamic Range.

Figure 4:
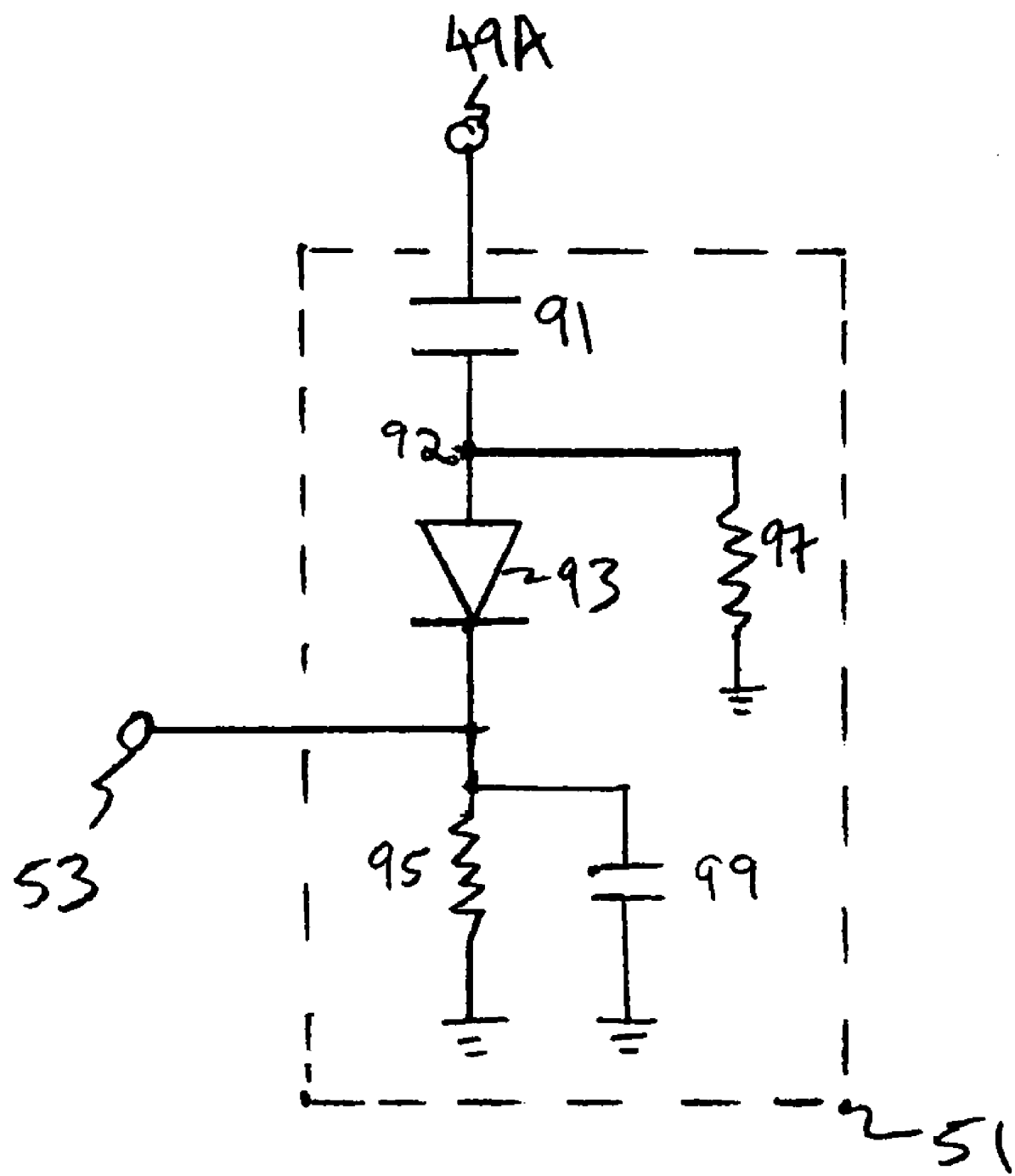
FIG. 4 shows an alternate embodiment for a detector.

FIG. 4 shows an alternate embodiment for a detector 51 to detect the peak voltage at node 49A. A capacitor 91, a diode 93, and a resistor 95 are connected in series between node 49A and ground. The node between the capacitor 91 and the diode 93 is node 92. Another capacitor 99 is connected in parallel with resistor 95. A second resistor 97 is connected between node 92 and ground. The node between the diode 93 and the resistor 95 is the output 53 of the detector 51. The voltage at output 53 corresponds to the peak voltage at node 49A. As the signal at node 49A increases in voltage, the diode 93 becomes forward-biased, and the voltage at node 53 will also rise concurrently with the voltage at node 49A, less a diode drop and any DC bias in the signal due to the capacitor 91. However, once the voltage at node 49A decreases, the diode 93 becomes reverse-biased, and the value at node 53 will remain stuck at a peak voltage due to the charge storage on capacitor 99. This peak voltage is the power indicator 53 and can be used to estimate the power level at RF_out and control the gain of the power amplifier 43.

In an alternate embodiment of the detector 51, the capacitor 91 may be eliminated to create a DC connection to node 49A. Since the battery charge of a mobile device varies over time, the DC bias of the signal at node 49A will also vary with time. To correct for the DC bias in the signal, the voltage Vbatt should be subtracted from the voltage at node 53. This may be accomplished by connecting a second diode to the battery supply (isolated from the signal at node 49A) to measure a reference voltage. Then, the reference voltage is subtracted from the voltage at node 53 to obtain a corrected value for the power indicator.

In an alternate embodiment, the detector 51 may detect the peak current passing through the drain of transistor 73 to estimate the power level at RF_out.

In alternate embodiments, the detector 51 may also be connected to nodes other than node 49A. These alternative connections for the detector 51 are illustrated with dotted lines leading from the detector 51. For example, the detector 51 may be connected to node 49B to detect the voltage at the gate of transistor 75. Or, the detector 51 may be connected at node 49C to detect the current passing through the source of transistor 73. The detector 51 may also be connected to other stages of the power amplifier 43. For example, the detector 51 may be connected to node 49D, which is the input to the second gain stage. The detector 51 can be connected to any node in the amplifier 43 that is isolated from the output by at least one gain stage and has a power level that has a substantial linear correspondence to the power level at the output 45.

The gain control circuit shown in FIG. 3 is a comparator 77 that compares the power indicator 53 to a reference voltage Vref. The value of Vref may be influenced by external conditions (e.g. temperature, battery charge, etc.) and input from external sources such as a mobile phone base station. The output 79 ("comparator output 79") of the comparator 77 is the difference between Vref and the power indicator 53. The comparator output 79 is used to adjust the gain of the power amplifier 43 so as to maintain a constant signal power and drive level at node 49A. The comparator output 79 as shown in FIG. 3 leads back as an input into the power amplifier 43 to adjust its gain. However, it is not shown in FIG. 3 how the comparator output 79 adjusts the gain within the power amplifier 43, since there are several different ways to control the gain of the power amplifier 43, all of them equally acceptable. For example, the gain of the power amplifier 43 can be adjusted by adjusting the input power to the input transistor 73. Or, the drain voltage of transistor 71, transistor 73, or transistor 75 can be adjusted. Or, all the drain voltage of all three transistors can be adjusted.

In an alternate embodiment, a directional coupler is inserted between 49A and the detector 51, for coupling to and sensing the power level of the signal 49A. Although there are size disadvantages to using a directional coupler (since the power amplifier circuit 41 can no longer be formed as a single IC), it is still a functional solution and may be a viable option in systems where size may not be as great a consideration.

Although the present invention has been described in detail with reference to particular preferred embodiments, persons possessing ordinary skill in the art to which this invention pertains will appreciate that various modifications and enhancements may be made without departing from the spirit and scope of the claims that follow.

We claim:

1. An amplifier circuit operable to amplify a radio frequency (RF) input signal to a prescribed power level, comprising:
    an isolating gain stage in an adjustable gain amplifier, operable to produce an RF output signal at an output port;
    a node in the adjustable gain amplifier isolated from the output port by the isolating gain stage, wherein a signal at the node has a power level that corresponds to the output power level of the RF output signal;
    a detector connected to the node, the detector operable to detect the power level of a signal at the node and generate a power level indicator; and
    a gain control circuit coupled to the detector, the gain control circuit operable for adjusting the gain of the adjustable gain amplifier in response to the power level indicator,
    wherein the adjustable gain amplifier and detector are formed on an integrated circuit.

2. An amplifier circuit as in claim 1, wherein
    the isolating gain stage includes a first transistor, and
    the node is isolated from the output port by an internal impedance of the first transistor.

3. An amplifier circuit as in claim 2, wherein the detector detects the peak voltage at the node.

4. An amplifier circuit as in claim 2, wherein the detector detects the peak current passing through the node.

5. An amplifier circuit as in claim 2, wherein the gain control circuit is a comparator comparing the power level indicator to a reference signal to generate a control signal for adjusting the gain of the adjustable gain amplifier.

6. An amplifier circuit as in claim 2, the adjustable gain amplifier further comprising:
    a driver gain stage driving the isolating gain stage.

7. An amplifier circuit as in claim 6, wherein
    the driver gain stage includes a second transistor, and
    the node is the drain or collector of the second transistor.

8. An amplifier circuit as in claim 6, wherein the node is the source or emitter of the second transistor.

9. An amplifier circuit as in claim 1, wherein the circuit includes a component of the type selected from the group consisting of enhancement-mode pseudomorphic high electron mobility transistors (E-pHEMT), pseudomorphic high electron mobility transistors (pHEMT), heterojunction bipolar transistors (HBT), bipolar junction transistors (BJT), lateral diffusion metal oxide semiconductor field effect transistors (LDMOS FET), metal oxide semiconductor field effect transistors (MOSFET), complementary metal oxide semiconductors (CMOS), field effect transistors (FET), and metal semiconductor field effect transistors (MESFET).

10. An amplifier circuit as in claim 1, wherein the RF signal has a frequency greater than 400 megahertz.

11. An amplifier circuit as in claim 1, wherein the RF signal conforms to a protocol selected from the group consisting of Global System for Mobile Communications (GSM), Enhanced Data rate for GSM Evolution (EDGE), Code Division Multiple Access (CDMA), North American Digital Cellular (NADC), and Wideband Code Division Multiple Access (WCDMA) and Universal Mobile Telecommunications System (UMTS).

12. An amplifier circuit as in claim 1, further comprising a directional coupler between the node and the detector.

13. A method for maintaining a constant output power for an RF amplifier circuit, comprising:
    amplifying an input RF signal with an adjustable gain amplifier;
    isolating a node within the adjustable gain amplifier from an output load with an output gain stage;
    detecting a signal power level at the node; and
    adjusting the gain of the adjustable gain amplifier in response to the signal power level to maintain a constant signal power level at the node into the output gain stage.

14. A method as in claim 13, wherein
    detecting a signal power level includes detecting a peak voltage level.

15. A method as in claim 13, wherein
    detecting a signal power level includes detecting a peak current level.

16. A method as in claim 13, wherein amplifying an input RF signal includes amplifying with a plurality of cascaded gain stages.

17. A method as in claim 13, wherein
    detecting a signal power level is accomplished by capacitively coupling to the node.

18. A method as in claim 13, wherein
    detecting a signal power level is accomplished by connecting to the node with a direct current (DC) connection.

* * * * *